United States Patent
McArdle et al.

(10) Patent No.: US 6,378,985 B2
(45) Date of Patent: Apr. 30, 2002

(54) INK-JET PRINTER HAVING CARRIAGE AND FLEXIBLE CIRCUIT MOVABLY CONNECTED, METHOD AND APPARATUS

(75) Inventors: Karen McArdle, Maynooth (IE); Marcus Scholz; Steven R. Card, both of San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/769,043

(22) Filed: Jan. 24, 2001

Related U.S. Application Data

(63) Continuation-in-part of application No. 09/557,447, filed on Apr. 25, 2000, now Pat. No. 6,273,554.

(51) Int. Cl.⁷ .................................................. B41J 23/00
(52) U.S. Cl. ............................................................ 347/49
(58) Field of Search .......................... 347/37, 49, 39, 347/50

(56) References Cited

U.S. PATENT DOCUMENTS

| | | | |
|---|---|---|---|
| 4,706,097 A | 11/1987 | Harmon | 346/139 C |
| 4,755,836 A | 7/1988 | Ta et al. | 347/49 |
| 4,771,295 A | 9/1988 | Baker et al. | 347/87 |
| 4,872,026 A | 10/1989 | Rasmussen et al. | 347/56 |
| 4,907,018 A | 3/1990 | Pinkerpell | 346/139 R |
| 5,392,063 A | 2/1995 | Rhoads | 347/49 |
| 5,917,518 A | * 6/1999 | Ohashi et al. | 347/37 |
| 6,273,554 B1 | * 8/2001 | McArdle et al. | 347/49 |

* cited by examiner

Primary Examiner—Anh T. N. Vo

(57) ABSTRACT

An ink-jet printer includes an ink-jet cartridge having a flexible circuit connecting to a carriage in a relatively movable but movably constrained relationship. The carriage and the flexible circuit cooperatively define an instant center so that an array of electrical contact pads of the flexible circuit is reliably and repeatably positioned relative to the carriage, while manufacturing variabilities and thermal differential expansions between the carriage and flexible circuit, for example, are accommodated without loss of relative positional control of the array of contact pads and the carriage.

14 Claims, 11 Drawing Sheets

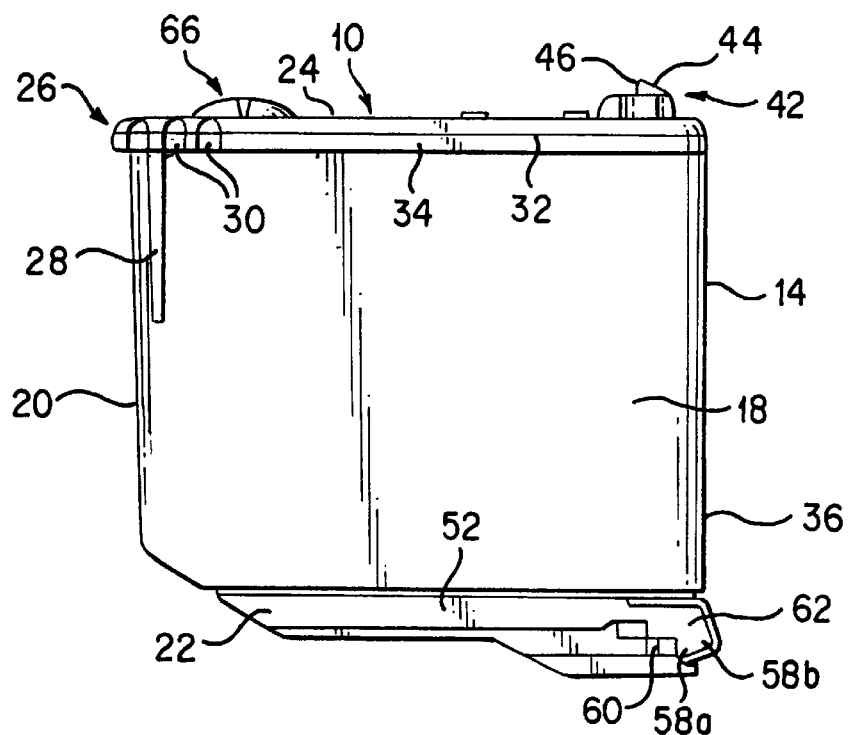
FIG. 2
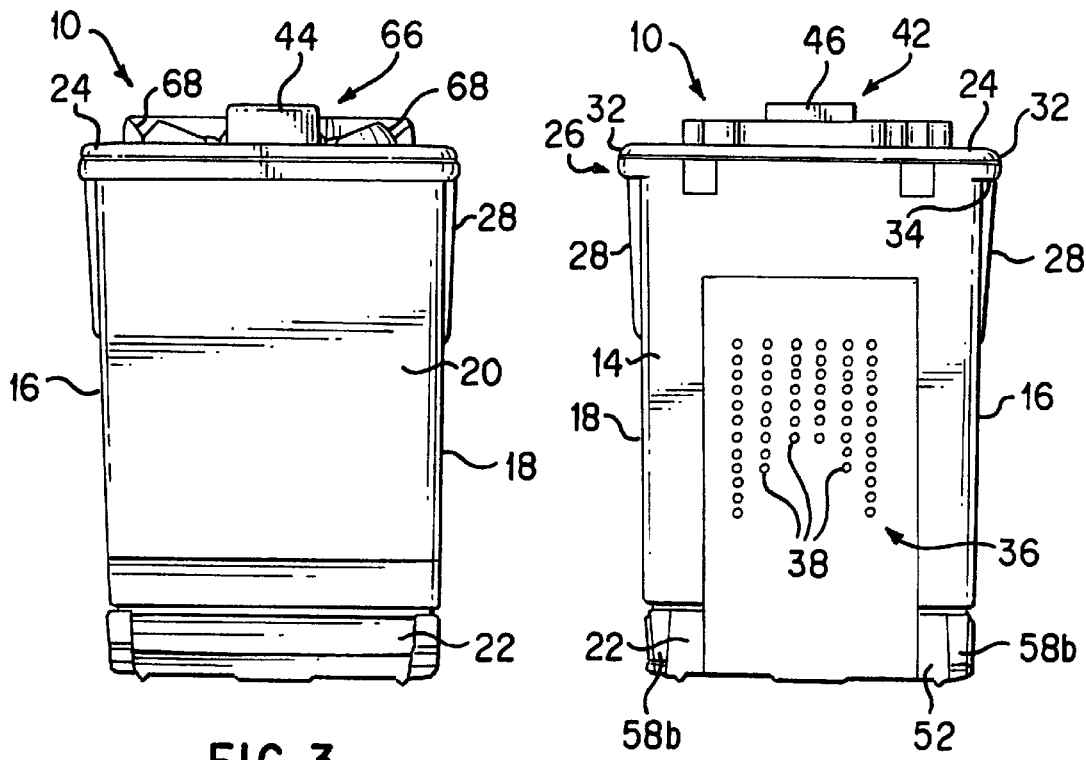
FIG. 3
FIG. 4

INK-JET PRINTER HAVING CARRIAGE AND FLEXIBLE CIRCUIT MOVABLY CONNECTED, METHOD AND APPARATUS

RELATED APPLICATIONS

This application is a Continuation-in-Part of U.S. application Ser. No.: 09/557,447, filed Apr. 25, 2000, by Karen M. McArdle, Marcus Scholz, and Steven R. Card, entitled, "Apparatus for Aligning a Flexible Circuit on an Ink Jet Printer Carriage, now U.S. Pat. No. 6,273,554, issued Aug. 14, 2001.

Additionally, this application is related to the following copending utility patent applications, each filed on Jan. 5, 2000, each of which is incorporated by reference to the extent necessary for a complete and enabling disclosure of the present invention: Ser. No.: 09/477,644, by Junji Yamamoto et al., entitled "Horizontally Loadable Carriage For An Ink-Jet Printer"; Ser. No.: 09/477,645, by Ram Santhanam et al., entitled "Vent For An Ink-Jet Print Cartridge"; Ser. No.: 09/477,646, by Ram Santhanam et al., entitled "Ink-Jet Print Cartridge Having A Low Profile"; Ser. No.: 09/477,648 by Matt Shepherd et al., entitled "New Method of Propelling An Inkjet Printer Carriage"; Ser. No.: 09/477,843 by Ram Santhanam et al., entitled "Techniques For Adapting A Small Form Factor Ink-Jet Cartridge For Use In A Carriage Sized For A Large Form Factor Cartridge"; Ser. No.: 09/477,860 by Keng Leong Ng, entitled "Low Height Inkjet Service Station"; Ser. No.: 09/477,940 by Ram Santhanam et al., entitled "Multiple Bit Matrix Configuration For Key-Latched Printheads"; Ser. No.: 09/478,148 by Richard A. Becker et al., entitled "Techniques For Providing Ink-Jet Cartridges With A Universal Body Structure"; Ser. No.: 09/478,190 by James M. Osmus, entitled "Printer With A Two Roller, Two Motor Paper Delivery System"; and Ser. No.: 09/116,564 by Ram Santhanam et al., entitled "Ink Jet Print Cartridge".

BACKGROUND OF THE INVENTION

1. Field of Invention

The present invention relates generally to ink-jet print cartridges, to ink-jet printers, and more particularly, relates to loading and unloading an ink-jet print cartridge into and from such a printer by use of substantially only a horizontal relative translational motion. Further, this invention relates to such an ink-jet printer having a flexible circuit with multiple conductors and contact pads that serves to electrically connect signals between the printer and an ink-jet print cartridge carried in a carriage of the printer. The carriage and flexible circuit cooperatively allow for selectively controlled relative movements so that the flexible circuit is not buckled or distorted as a result of such factors as manufacturing variabilities in these components of the printer. While accommodating these selected relative movements between the flexible circuit and carriage, these components cooperatively define an instant center such that the location of the array of contact pads is determined and certain relative to the carriage, insuring reliable and repeatable electrical contact between these contact pads and the electrical contacts of an ink-jet print cartridge received into the carriage.

2. Related Technology

The general construction and operation of an ink-jet print cartridge Is disclosed in U.S. Pat. No. 4,771,295, entitled "Thermal Ink Jet Pen Body Construction Having Improved Ink Storage and Feed Capacity," by Baker, et al., issued Sep. 13, 1988.

The general design and construction of an ink-jet printer with a carriage that retain and align ink-jet print cartridges in printers and scan these print cartridges through print zones is well known. Examples of the patents that have issued in this field of technology include: U.S. Pat. No. 4,755,836, entitled "Printhead Cartridge and Carriage Assembly," by Ta, et al., issued Jul. 5, 1988; U.S. Pat. No. 4,872,026, entitled "Ink-jet Printer with Printhead Carriage Alignment Mechanism," by Rasmussen, et al., issued Oct. 3, 1989; U.S. Pat. No. 4,907, 018, entitled "Printhead-Carriage Aligment and Electrical Interconnect Lock-in Mechanism," by Pinkerpell, issued Mar. 6, 1990; U.S. Pat. No. 5,392,063, entitled "Spring Cartridge Clamp for Inkjet Printer Carriage," by Rhoads, issued Feb. 21, 1995, and U.S. Pat. No. 4,706,097, by Harmon, entitled, "Near-linear Spring Connect Structure for Flexible Interconnect Circuits," dated Nov. 10, 1987.

Prior ink-jet printers, and prior ink-jet print cartridges have been designed to be loaded and unloaded into and from the carriages of these printers either by relatively moving the cartridge vertically, or by moving the cartridge substantially vertically along with a steep, inclined, arcuate motion. Such ink-jet printer and cartridge designs have proven to be satisfactory as long as vertical access to the printer is provided. Such vertical access is generally provided by configuring the printer to be a desk-top device, and by providing the printer with a door or lid that opens to allow access vertically downwardly into the printer. This conventional printer design has meant, however, that access to the printer from vertically above had to remain unrestricted, and that nothing could be permanently stacked on top of a conventional printer.

Further, previous top loading inkjet printer designs have fostered an increasing growth in printer height so that with each new printer design, the profile height of the conventional printers increased.

On the other hand, it is believed that users of ink-jet printers want a printer for home use that can be stacked in an entertainment center or used unobtrusively in a living room. This user desire requires an ink-jet printer that has both a flat top and bottom, that is "front loading," which also has all controls and status indicators on the front panel, and that is about the same size as a conventional stereo amplifier or a video cassette recorder (VCR). In other words, users desire an ink-jet printer for home use which has an overall height of about four inches (4") or less.

Such requirements for an inkjet printer cause many design challenges. First, as is pointed out above, nearly all existing ink-jet printers and ink-jet cartridges use interface structures for receiving and locating the ink-jet cartridge within a movable carriage of the printer, that require substantially vertical movements of the cartridge into and out of the carriage. These interface structures are sometimes referred to as "datum structures," and on present day conventional ink-jet print printers and print cartridges are designed for vertical or near vertical installation of the print cartridge.

Moreover, front or horizontal loading of an ink-jet cartridge into an ink-jet printer has not heretofore been contemplated, so structures and methods to successfully implement a front or horizontal loading of the cartridge do not exist. Additionally, on a front loading printer the user's view into the printer during cartridge installation will necessarily be quite restricted. The user will be able to see considerably less of the printer carriage, and less of the loading process, than is the case with top loading conventional printers. Third, physical access to the printer carriage will be more limited with front loading of the printer cartridge into the printer. Fourth, if multiple print cartridges are used by the printer, they must sit so close together in the printer carriage that much of the gripping surfaces of the cartridges are unavailable for loading or unloading the print cartridges into and from the printer.

Thus, it is apparent from the foregoing that although there are many different conventional ink-jet printer cartridge and carriage designs, no acceptable design exists for implementing a front loading, stackable, ink-jet printer of low overall height. Thus, such a horizontally loadable inkjet printer presents many challenges.

SUMMARY OF THE INVENTION

In view of the deficiencies of the related conventional technology, an object for this invention is to reduce or eliminate one or more of these deficiencies.

Briefly and in general terms, an ink-jet print cartridge, and inkjet printer method and apparatus according to the invention includes a generally rectangular prismatic print cartridge, a pair of elongate supporting lips located on opposite side walls of the print cartridge, a carriage, a chute mounted on the carriage for receiving the print cartridge, and a pair of spaced apart guide structures at side walls of the chute for guiding the print cartridge horizontally into a selected determined engagement with the carriage.

In operation, when a user places an ink-jet print cartridge at the entrance of the chute and presses it horizontally into the printer, the cooperative structural features of the printer and print cartridge result in horizontal loading of the print cartridge into the carriage by translating the print cartridge horizontally forward into the carriage, engaging a lip on the print cartridge with a guide rail on the carriage, sliding the print cartridge up and over a datum structure on the carriage with the guide rail by effecting selected pitching motions of the cartridge, and then latching the print cartridge in the carriage. When a user wants to unload a print cartridge from the printer, the user pushes downwardly on an exposed rear portion of the print cartridge, and by so doing rotates a rear end of the cartridge downwardly, unlatching the print cartridge. The user can then grasp exposed gripping surfaces of the print cartridge and slide the cartridge horizontally out of the carriage. As the user pulls the print cartridge outwardly from the carriage, the cooperating structural features of the printer carriage and print cartridge prevent the cartridge from tumbling out of the carriage, rotates the print cartridge about a datum on the carriage and disengages the datum structures of the carriage and cartridge (i.e., by selected pitching motions of the cartridge), and then allows horizontal translation of the print cartridge out of the carriage.

Other aspects and advantages of the invention will become apparent from the following detailed description of selected preferred exemplary embodiments of the invention, taken in conjunction with the accompanying drawings, which illustrate the principles of the invention by way of example. Throughout the accompanying drawing Figures, like reference numerals indicate either the same feature, or features which are analogous in structure or function.

BRIEF DESCRIPTION OF THE DRAWING FIGURES

FIG. 1 provides is a perspective view of an ink-jet print cartridge embodying the present invention;

FIG. 2 is a right side elevation view of the print cartridge of FIG. 1;

FIG. 3 is a rear side elevation view of the print cartridge of FIG. 1;

FIG. 4 is a front side elevation view of the print cartridge of FIG. 1;

Figure 1:
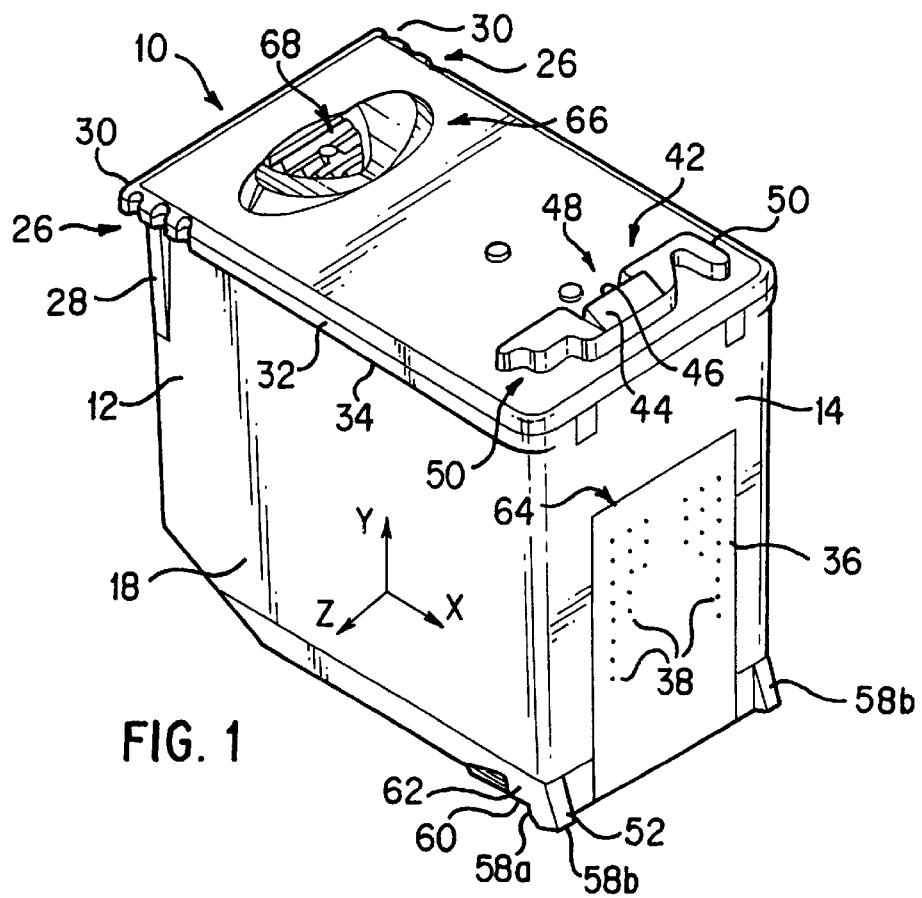
Figure 12:
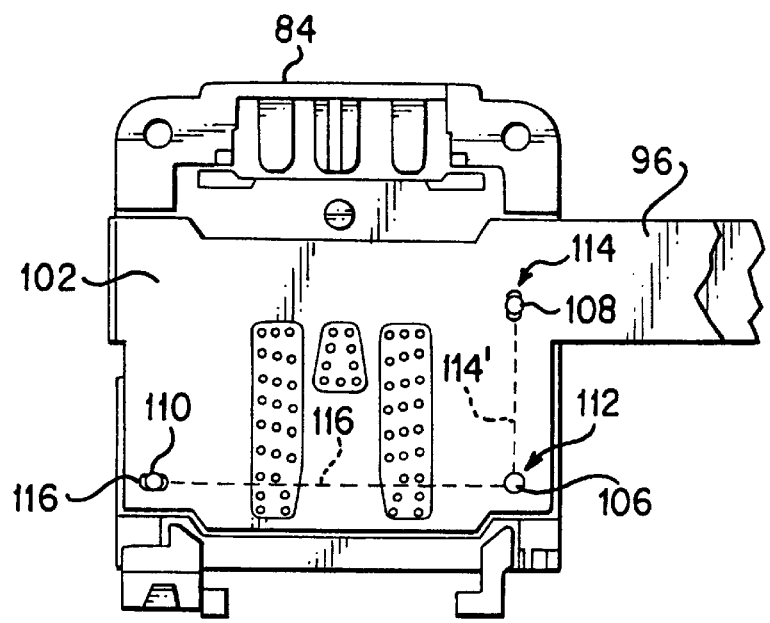
Figure 8:
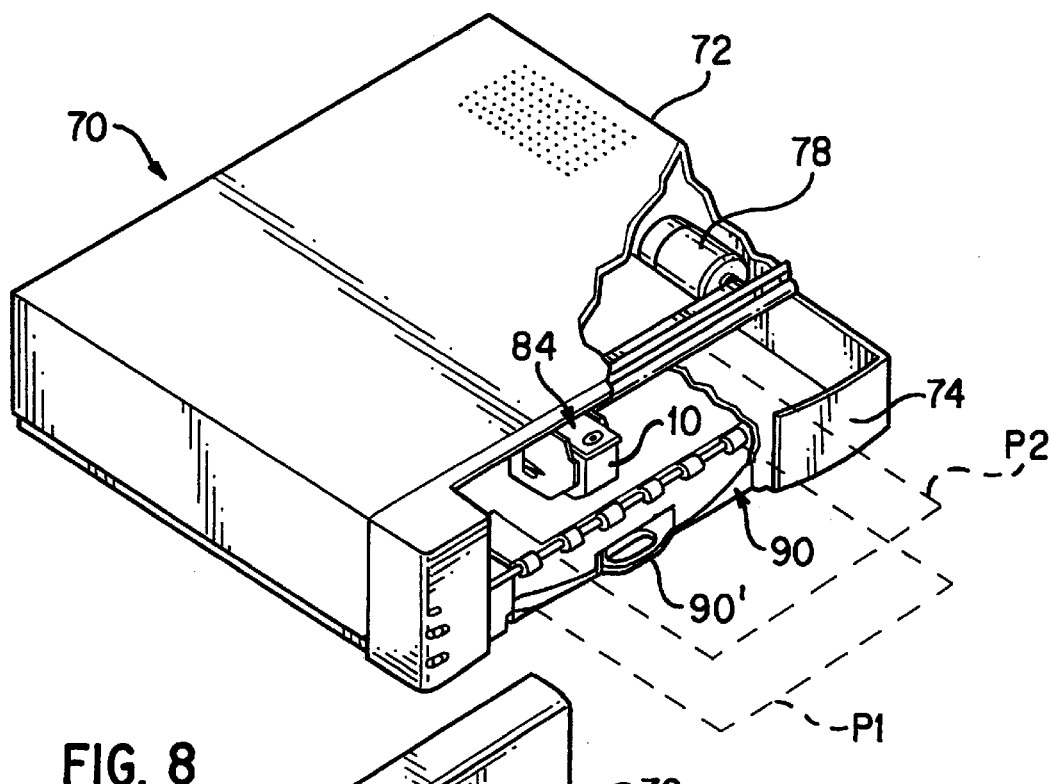
FIG. 8 is a perspective view, in section and partially cut away, of an ink-jet printer embodying the principles of the invention.
Figure 9:
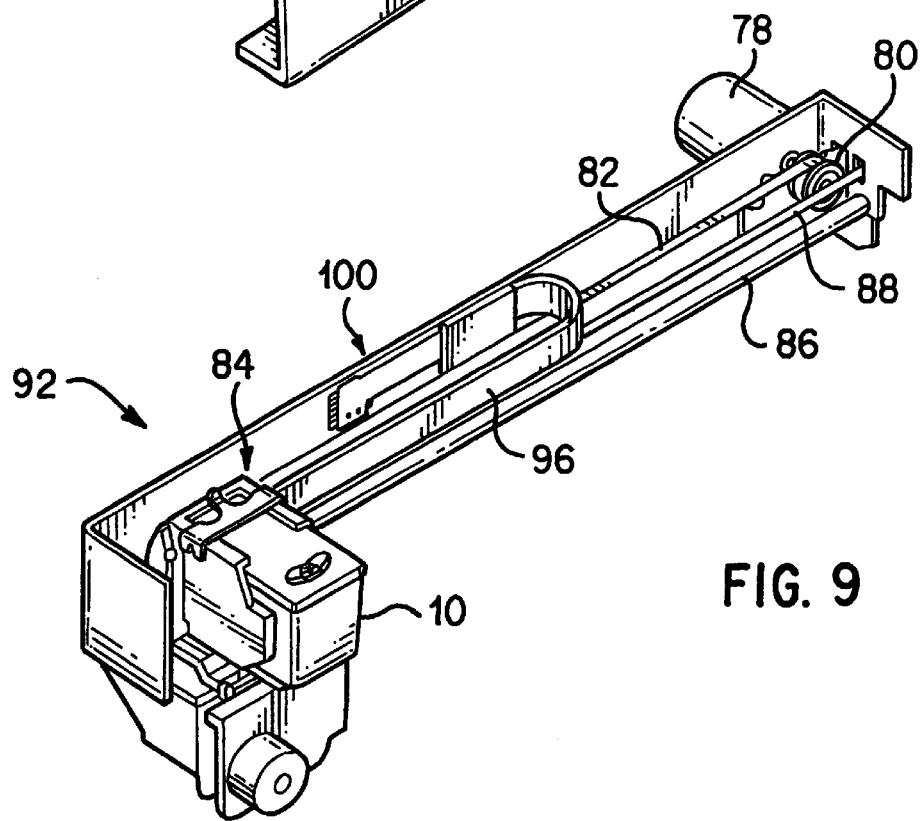
Figure 10:
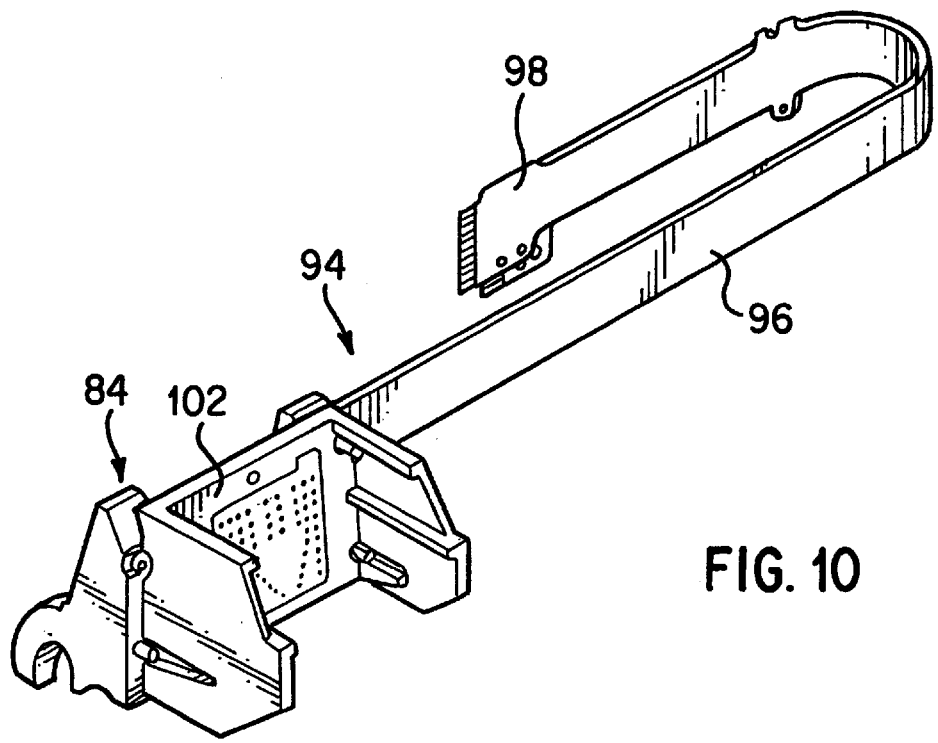
Figure 11:
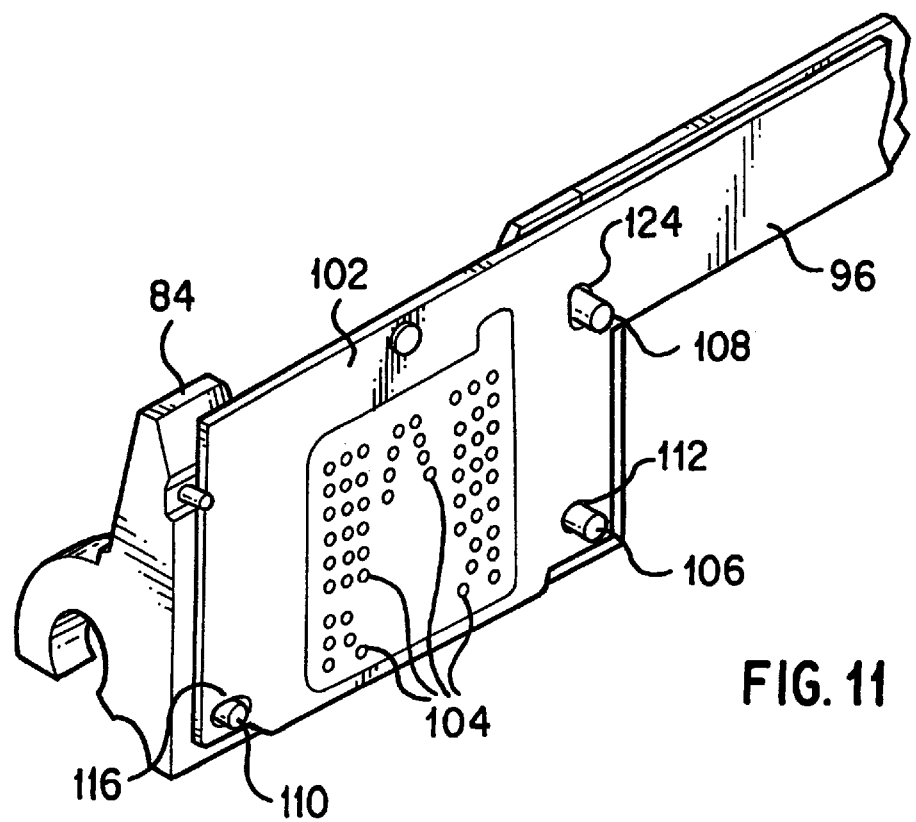
Figure 23:
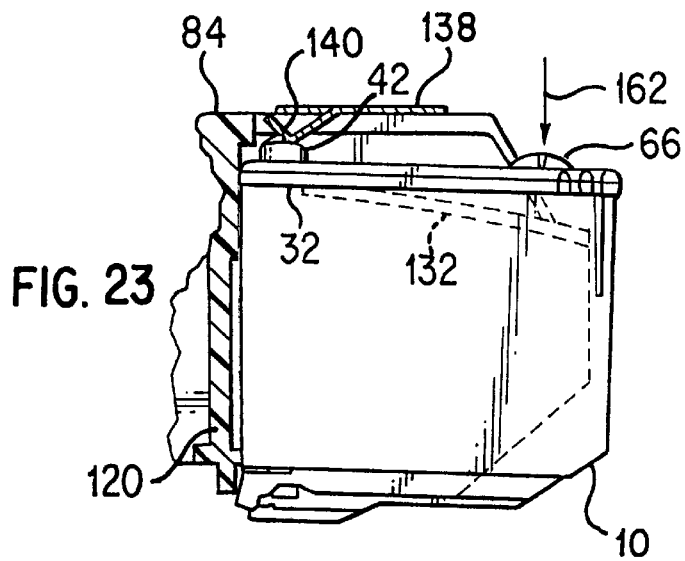
Figure 24:
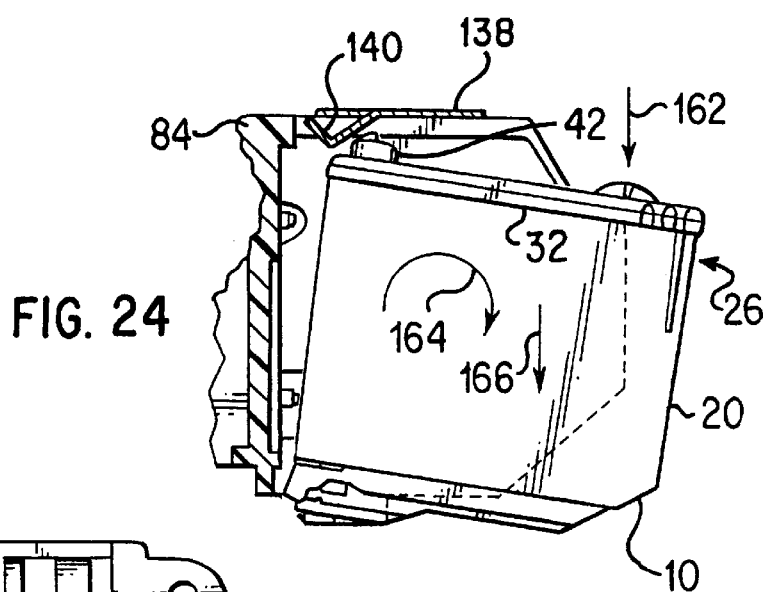
Figure 13:
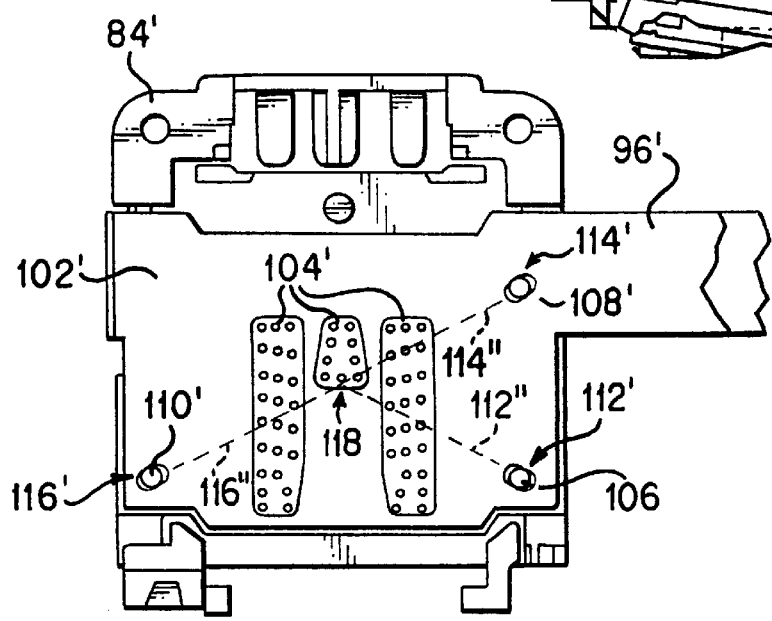
Figure 14:
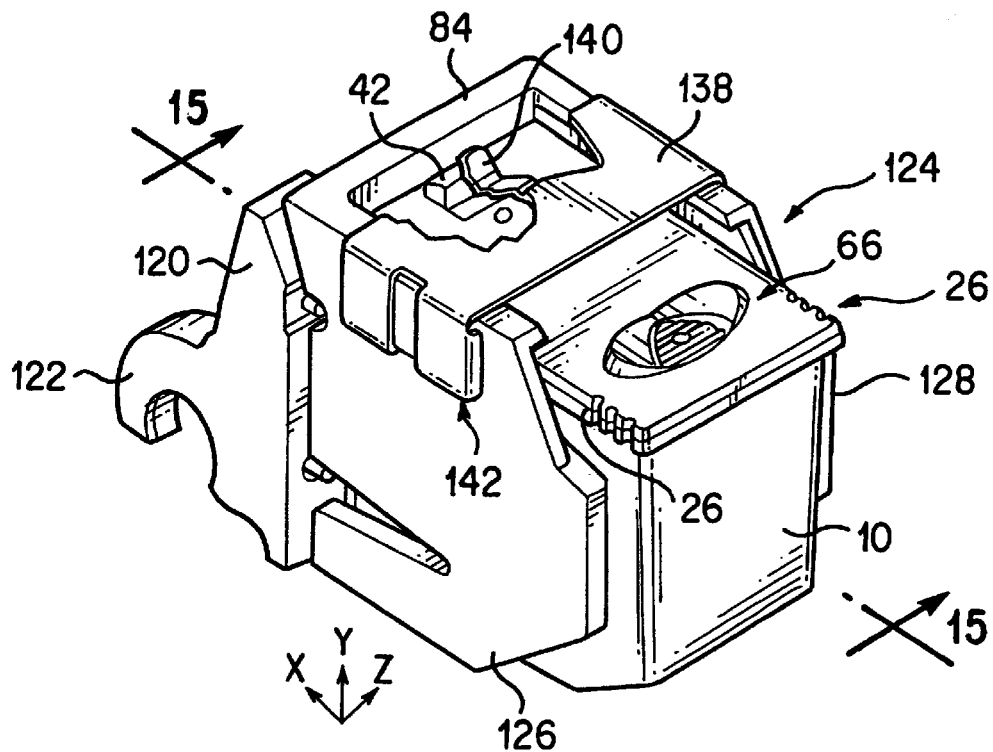
Figure 15:
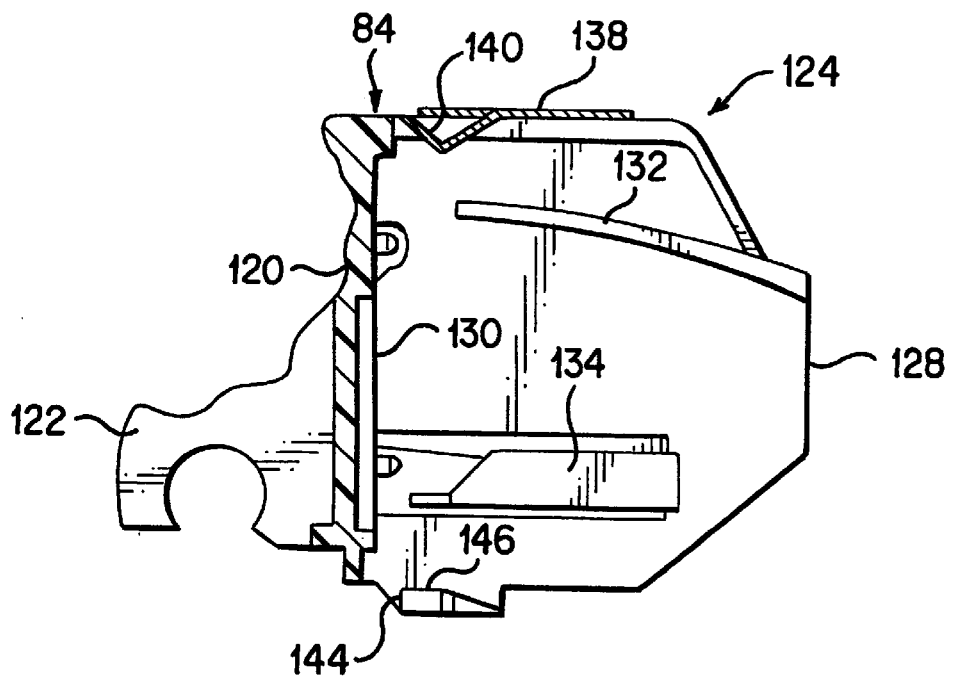
Figure 16:
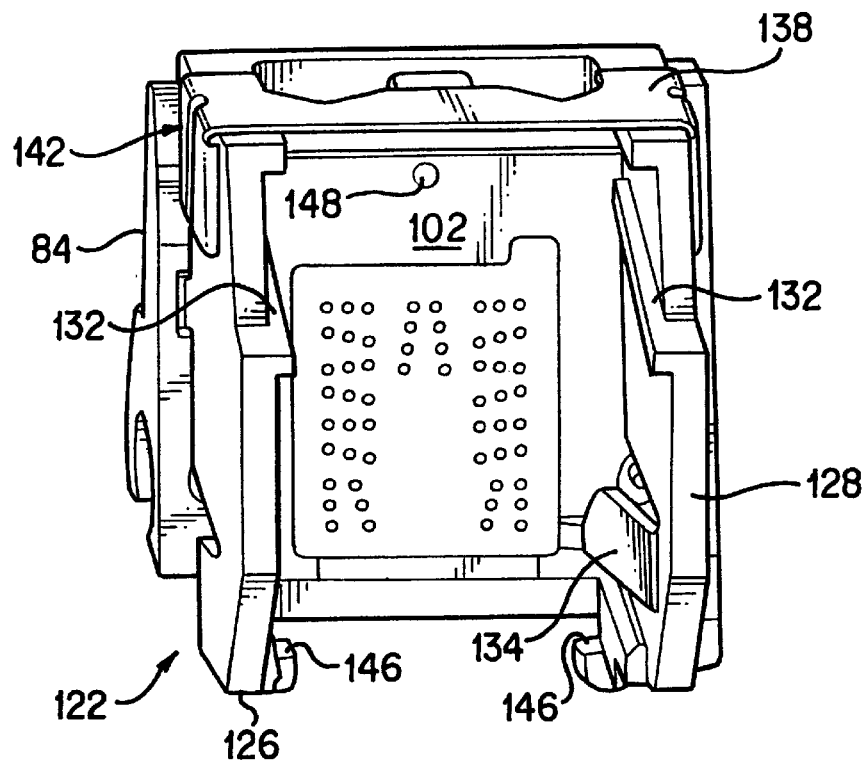
Figure 17:
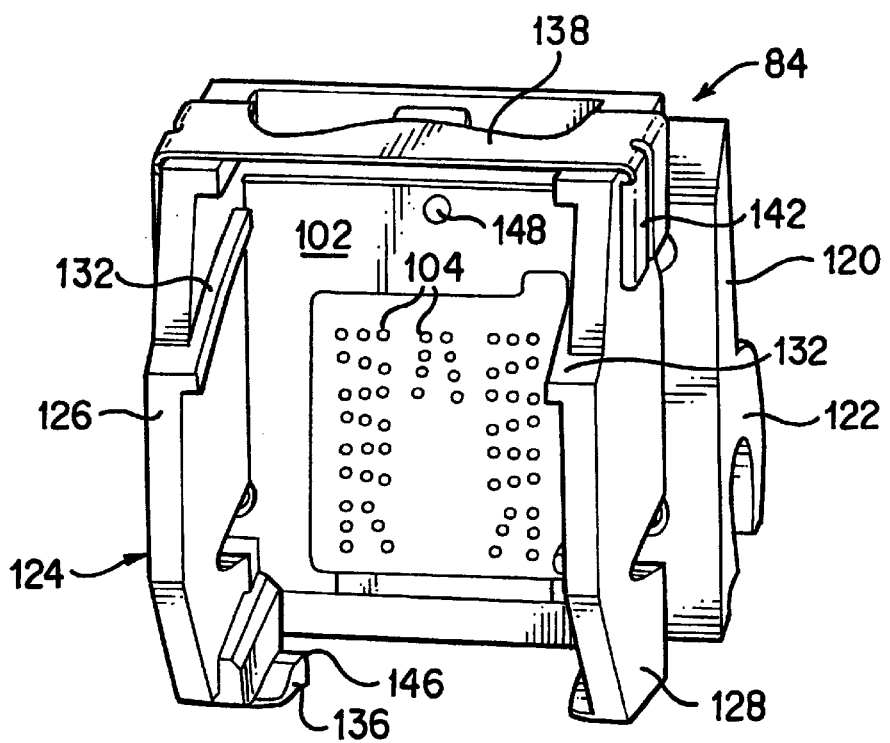
Figure 18:
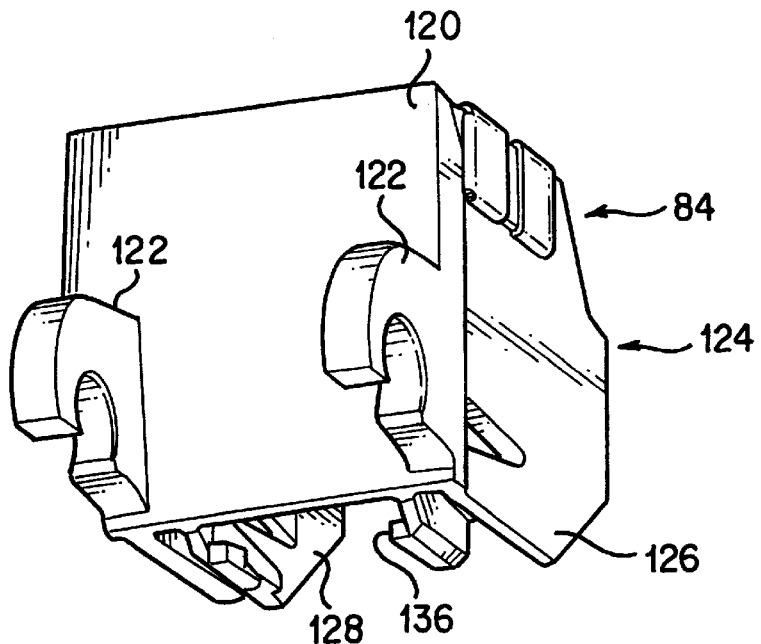
Figure 25:
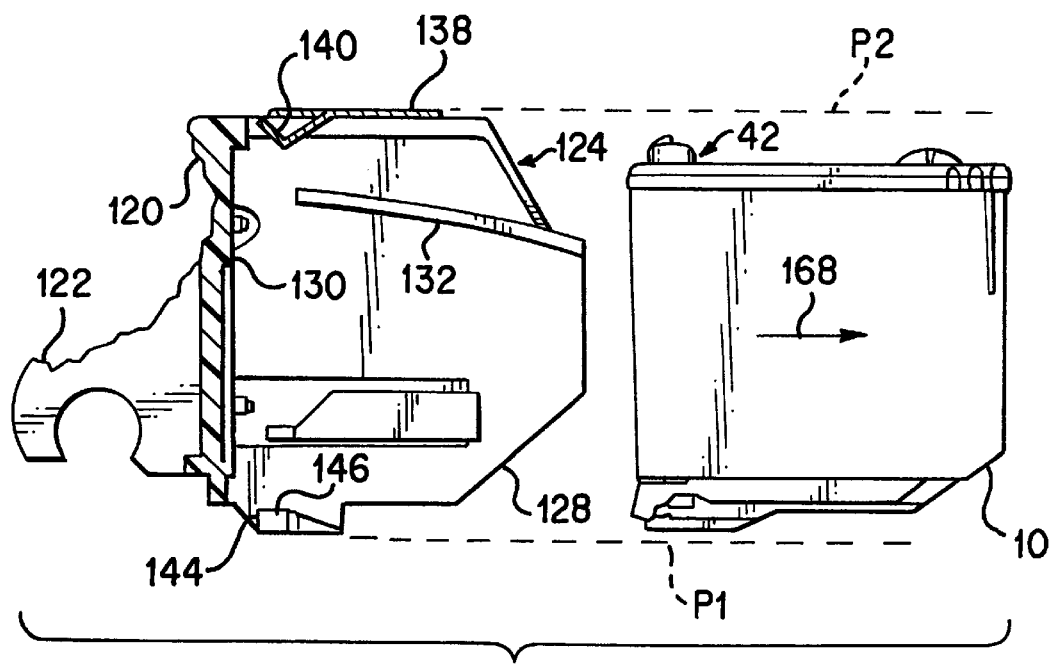

FIG. 9 provides a perspective view of a portion of the mechanism of the printer seen in FIG. 8;

FIG. 10 provides a perspective view of a carriage portion of the mechanism seen in FIG. 9;

FIG. 11 is a perspective view with parts removed for clarity of illustration, of a base portion of the carriage seen in FIG. 10;

FIG. 12 provides a front elevation view of the carriage base portion seen in FIG. 11;

FIG. 13 provides a front elevation view similar to that of FIG. 12, but illustrating an alternative embodiment of the present invention;

FIG. 14 provides a perspective view, partially cut away for clarity of illustration, of the carriage of FIG. 10 and the ink-jet print cartridge of FIG. 1 together in an operative position;

FIG. 15 is a side elevation view, in section taken along line 15—15 of the carriage seen in FIG. 14, but with the print cartridge removed for clarity of illustration and with a portion of the carriage broken away to better fit this illustration within the view of the drawing sheet;

FIGS. 16 and 17 are front perspective views of the carriage of FIG. 14, and again are shown with the print cartridge removed for clarity of illustration;

FIG. 18 is a rear perspective view of the carriage of FIGS. 10 and 14; again the print cartridge removed;

FIGS. 19–23, inclusive are side elevation views, in section, partially cut away and with a portion of the carriage broken away to better fit these illustrations within the views of the drawing sheets, all taken along line 15—15 of the carriage of FIG. 14, and illustrating the sequence of steps in the process of horizontally loading and latching the ink-jet print cartridge of FIG. 1 in on operative position in the carriage of FIGS. 10 and 14; and FIGS. 24 and 25 are side elevation views, in section, partially cut away, and with a portion of the carriage broken away to better fit these illustrations within the views of the drawing sheets, both taken along line 15—15 of the carriage of FIG. 14, and illustrating the sequence of steps in the process of unlatching and horizontally unloading the ink-jet print cartridge from the carriage.

DESCRIPTION OF EXEMPLARY PREFERRED EMBODIMENTS OF THE INVENTION

As shown in the drawings for the purposes of illustration, it will be noted that the invention is embodied in a low-profile, horizontally elongated ink-jet print cartridge; and in a front loading, stackable, ink-jet printer having a low overall height.

The Print Cartridge

Referring to FIGS. 1–7, a low-profile, horizontally elongated ink-jet print cartridge 10 is illustrated. As will be further pointed out below, the reference directions of the cartridge relative to the vertical and horizontal directions of the cartridge 10 are not arbitrary, but are determined by the fact that the cartridge has a print head (further described below) with an array of fine-dimension print nozzles (also further described below) from which droplets of ink issue vertically downwardly during operation of the print cartridge 10. These ejected droplets of ink (i.e., the ink jets) travel a short distance from the print head vertically downwardly onto print media (i.e., paper) disposed below the print head, and on which these droplets form printed images and characters. The tiny droplets of ejected ink must travel substantially in a true vertically downward direction, so during operation the orientation of the print cartridge 10 relative to the vertical and horizontal directions is fixed.

It will be seen that the low-profile print cartridge 10 of the present invention allows an ink jet printer (to be further described hereinbelow) to be relatively shorter than conventional inkjet printers, while the print cartridge 10 still retains a relatively high ink capacity. Further, print cartridge 10 and the ink-jet printer are each configured mutually for horizontal loading and unloading of the print cartridge 10. This horizontal loading and unloading of the print cartridge allows other items, such as other home electronics, for example, to be stacked permanently on top of the ink-jet printer.

The print cartridge 10 includes a print cartridge body 12 that is generally of rectangular prismatic shape. This body has a front wall 14, a left side wall 16 (seen in FIG. 5), a right side wall 18 (seen in FIG. 2), and a back wall 20 (seen in FIG. 3). In order to complete the rectangular prismatic shape of the print cartridge 10, it is seen that the print cartridge includes also a lower wall 22, and a top wall 24. Although the invention is not so limited, the walls 14–24 of the exemplary preferred embodiment of print cartridge 10 intersect one another at an angle that is substantially 90 degrees. The low-profile body 12 has three orthogonal axes with orientations relative to the vertical and horizontal being determined by the necessary orientation of the print head (to be further described below), including an "X" axis, which is the major axis or axis of elongation (depth) extending between the front and back walls. Viewing FIG. 1, it is seen that a coordinate system is provided for convenient reference. The positive "X" direction points to the front of the print cartridge 10. The coordinate system is a conventional right-handed Cartesian system, so positive "Y" direction points upwardly, and the positive "Z" direction points out of the Figure toward the viewer.

The print cartridge 10 has "manual engagement" features, generally indicated with the arrowed numeral 26, which are disposed adjacent to the rear wall 20. These "manual engagement" features 26 are available for a user to grasp using the fingers during installation and removal of the print cartridge 10 into and from a printer. These manual engagement features 26 include a pair of vertically extending ribs 28, one on each of the side walls 16 and 18, and a plurality of notches 30 disposed along each side of the print cartridge 10 at each of a pair of horizontally and outwardly extending lips or ribs 32 formed at each side of the print cartridge 10 near the intersection of the side walls 16, 18 and the top wall 24. The notches 30 are disposed near the rear wall 20, and are somewhat aligned vertically with the ribs 28 so that these features are conveniently grasp with the fingers.

Figure 6:
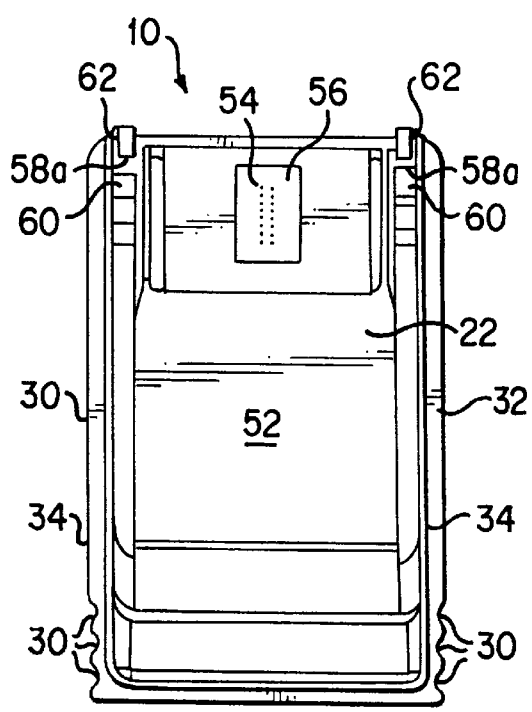
FIG. 6 is a bottom plan view of the print cartridge of FIG. 1.
Figure 7:
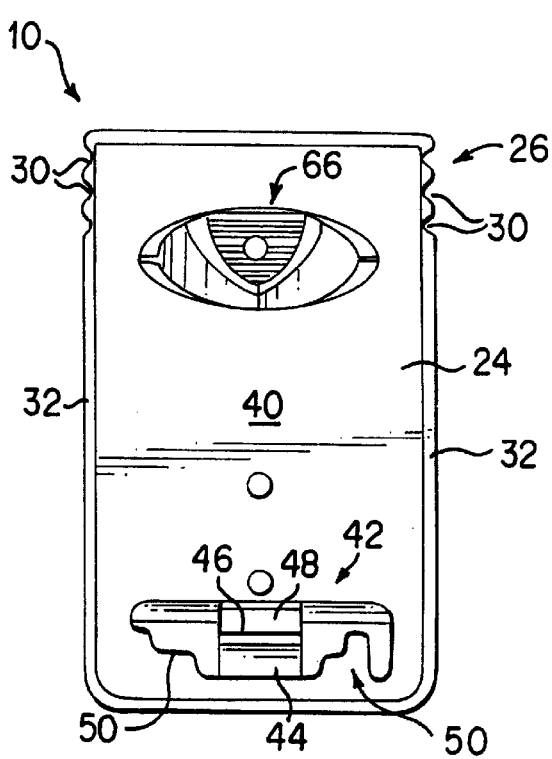
FIG. 7 is a top plan view of the print cartridge of FIG. 1.

It will be noted viewing FIG. 6, that the horizontally and outwardly extending ribs 32 provide respective underside surfaces 34 which extend outwardly beyond the side walls 16 and 18. Print cartridge 10 also includes an electrical connection portion 36 disposed on the front wall 14. The electrical connection portion 36 includes an array of plural electrical contact pads 38. These contact pads 38 serve to conduct electrical signals from a printer for energizing energy dissipating elements of the cartridge 10 at the print head (again, to be further described below). These contact pads 38 are preferably located as far from the manual engagement features 26 as is possible to better prevent a user from contaminating the contact pads 38 with, for example, fingerprints. Thus, it will be noted that the cartridge 10 has its longest dimension (i.e., its length) extending between the front and back walls to enhance this aspect of the cartridge.

Figure 5:
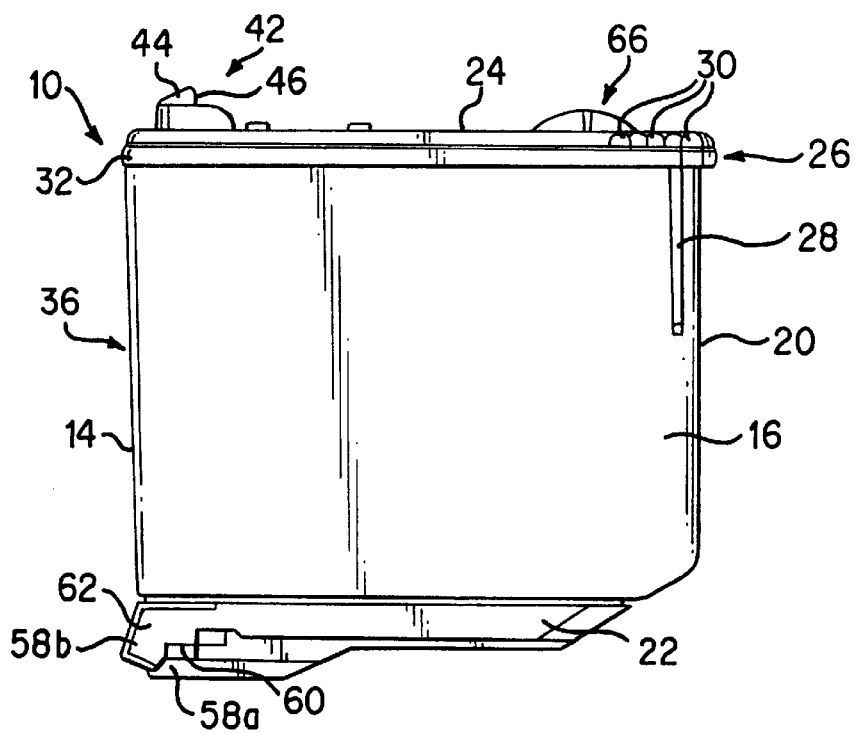
FIG. 5 is a left side elevation view of the print cartridge of FIG. 1.

Cartridge 10 also includes at top wall 24 a lid 40, which in the illustrated embodiment defines the top wall. The lid 40, which forms the top wall 24, joins the side, front, and back walls along side, front, and back margins, respectively. Included on the lid 40 is a latch feature 42 that is spaced somewhat rearwardly away from the front margin. The latch 42 along with additional features of the cartridge 10 to be further described hereinbelow, serve to secure the print cartridge 10 within a printer carriage. As is illustrated in FIGS. 1, 2, and 5, the latch 42 has a triangular cross section formed by a latch ramp 44 and a vertically extending latch wall 46. The latch ramp 44 has three functions: to gradually increase the installing or latching force that must be exerted by the user when installing the print cartridge 10 in a printer; to ease the opening of a latch spring (further described below) during installation of the cartridge 10 into a printer carriage; and to continuously force the print cartridge 10 out of the printer carriage until the print cartridge is precisely seated in the carriage, whereupon the outwardly directed force on the print cartridge suddenly terminates as the cartridge "snaps" into place within the carriage, as the latch spring engages the latch wall 46. This latter feature prevents "false latching" of the print cartridge. The latch wall 46 is located perpendicularly to the horizontal top surface of the lid 40, and is the surface engaged by the latch spring when the print cartridge is precisely seated in the carriage of the printer.

The latch structure 42 further includes a latch well 48 located behind the latch wall 46. This latch well 48 is a relieved area in the lid 40 permitting the latch spring to travel into this well as is necessary to maintain a constant latching force during the life of the printer and despite dimensional variabilities in the print cartridges. The latch structure 40 also has two sets of keys 50 located one on either side of the latch ramp 44, and which can serve to identify the print cartridge 10 to a printer.

Viewing now FIGS. 1, 2, 3, 5, and particularly FIG. 6, it is seen that the body 12 of print cartridge 10 also includes a nose piece 52 that is ultrasonically welded to the body 12. The nose piece 52 defines the lower wall 22 for the print cartridge 10. Depending on whether the print cartridge is a monochrome or multi-color cartridge, the nose piece may contain a single channel, or three or more channels, that each connect to a respective stand pipe in one (i.e., black ink) or in a respective one of several (i.e., multiple colors, for example, cyan, magenta, and yellow) ink chambers formed within the body 12. The channels direct the ink from the chambers to one series or to respective ones of plural series of vertically downwardly directed fine-dimension print nozzles 54 on a print head 56 (recalling that FIG. 6 provides a view looking vertically upwardly at the underside of the print cartridge 10).

Located on the nose piece 52 are two laterally spaced apart pairs of "X" axis datum surfaces 58a and 58b, and a pair of laterally spaced apart "Y" axis datum surfaces 60. It is noted that the datum surfaces 58a and 58b are disposed in opposite directions along the "X" axis. All of these datum surfaces are engagement or holding surfaces for the cartridge 10 relative to a printer carriage. The datum structures also provide a pair of spaced apart "Z" axis datum surfaces 62. An additional datum surface for the print cartridge 10 is provided by the front wall 14 of the print cartridge 10, as is indicated by the arrowed reference numeral 14' in FIG. 1, and this surface serves as a stop point for movement of the print cartridge 10 as it "snaps" into latched position within a printer carriage. The "X," "Y," and "Z" datum surfaces mate with corresponding datum surfaces at the carriage of a printer and align the print cartridge 10 in the carriage, as is explained in detail below.

Also located on the print cartridge body is a flex circuit 64 of conventional construction. The flex circuit 64 carries and defines the connection portion 36 and contact pads 38, and provides the electrical interconnection between the printer and the print head 56, which is also carried on the flex circuit 64. Thus, it is seen that the flex circuit 64 is disposed on front wall 14, and wraps from this front wall onto lower wall 22 to dispose the print head 56 on the bottom of the print cartridge 10.

Further to the above, as is best seen in FIGS. 1, 2, and 5, the lid 40 also carries a button-like upwardly protruding structure 66. In the top plan view of the print cartridge 10 (viewing FIGS. 1 and 7) this button structure 66 has an elliptical shape. In the back side elevation view (viewing FIG. 3), this button structure 66 has an outward opening, circular shape. In the side elevation views, FIGS. 2 and 5, this button structure has the shape of a chord of a circle. The middle of this button structure 66 is generally flush with the surrounding top surface of the lid 40, and contains a plurality of grooves 68. The grooves act as a gripping surface for a finger of a user. This button structure 66 has this unique shape to indicate inherently to a user where the user is to push downwardly in order to unlatch the cartridge 10 from a carriage of a printer. A short downward motion of the rear of the cartridge 10 resulting from such a downward push by a user (causing the print cartridge 10 to pitch downwardly and away from a carriage of the printer) unlatches the print cartridge 10 from the latch spring, as will be further explained.

The Printer

Referring now to FIG. 8, an ink-jet printer 70 having a case 72 with a front panel 74, is illustrated with part of both the case 72 and front panel 74 cut away, and also with its front loading door 76 removed and moved forwardly and downwardly toward the viewer of FIG. 1, both for clarity of illustration. The printer 70 includes a DC drive motor 78 mounted on a chassis (not illustrated in detail). Mounted on the shaft of the motor 78 is a pulley 80 (best seen in FIG. 9) which drives an endless loop belt 82. This loop belt moves back and forth (i.e., in one of its spans) as the drive motor 78 reverses in direction. The drive belt 82 is attached to a carriage 84 that scans laterally back and forth, leftwardly and rightwardly, viewing FIG. 8. The carriage 84 receives, holds, and carries an ink-jet print cartridge 10. The horizontal scanning motion of the carriage is guided by a slide rod 86. Located at the rear of the carriage 84 is a conventional encoder, not shown, which reads a stationary encoder strip 88. The movements of the encoder along with the carriage 84 relative to the stationary encoder strip 88 provides electrical signals enabling electrical circuits in the printer to determine the location of the carriage 84 along its scanning path.

The printer 70 also includes a paper feed mechanism (not illustrated) which passes a sheet of print media (paper, for example, although the invention is not so limited) under the printer carriage 84 and the print cartridge 10 in this carriage. After the printer 70 prints a sheet of media, the media is ejected into an output tray 90 on which a handle 90' is provided to allow the tray to be slid out of the front of the printer 70. Also, it will be seen viewing FIG. 8 that the carriage 84 is accessible for loading and unloading of a print cartridge 10 substantially only along horizontal translation lines aligned with the carriage 84. In order to further illustrate this constraint to loading and unloading print cartridges 10 into and from the printer 70 only along horizontally extending translation lines, two vertically spaced apart outwardly extending imaginary planes P1 and P2 are added to this illustration. The lower plane P1 extends horizontally outwardly of the printer 70 at the level of the lower extent of the carriage 84. Similarly, the upper plane P2 extends horizontally outwardly of the printer 70 at the level of the upper extent of the carriage 84. In order to load a print cartridge into the printer 70, a user must position the cartridge substantially between the planes P1 and P2, and move it through the vertical plane of the front panel 74 and into the carriage 84. Once the print cartridge is so positioned in the carriage, the rear surface of the print cartridge is substantially all that is accessible to the user, and the user applies a horizontal push with a finger tip to the rear wall 20 of the print cartridge 10 (i.e., forwardly into the carriage and toward the rear of the printer). This forward push by the user is effective to latch the print cartridge in place in the carriage 84.

Similarly, when the user is to remove a print cartridge 10 from the printer 70, only a very limited access to this cartridge is possible in view of the compact size and low height of the printer 70. Thus, the user must unlatch the print cartridge, grasp an exposed rear portion of the cartridge, and draw the cartridge outwardly of the printer by horizontal translational movement between the planes P1 and P2, until the cartridge moves free of the plane of the front panel 74 of the printer. Referring to FIG. 9, a portion of the chassis and mechanism 92 of the printer 70 is shown in isolation. This mechanism portion 92 carries the motor 78, pulley 80, belt 82, carriage 84, guide rod 86, and encoder strip 88. In FIG. 10, a portion 94 of the chassis and mechanism portion 92 is illustrated in additional isolation, and with portions of the carriage 84 removed for clarity of illustration.

In FIG. 10, it is seen that in order to carry electrical signals between the printer 70 and the print cartridge 10, the printer 70 includes an elongate flexible circuit 96. This flexible circuit 96 is shape-retaining, elongate, planar, but flexible in nature so that it can be repeatedly flexed in a plane parallel to the length of this flexible circuit, and with this plane of flexing disposed perpendicularly to the direction of planarity of the flexible circuit, as is illustrated in FIGS. 9 and 10. The flexible circuit 96 has a terminated end 98, which plugs into a connector (indicated by arrowed numeral 100) provided on the chassis portion 92. At its other end, the flexible circuit 96 defines a termination portion 102 which is received in and which is held in a determined position and orientation within the carriage 84. This termination portion 102 defines an array of raised connector pads 104, which mirrors the array of contact pads 38 on the front of print cartridge 10. Within a slight recess (not seen in the drawing Figures) on the carriage 84 and immediately behind the termination portion 102 is a spring pad (also not visible in the drawing Figures) which in alignment with the connector pads 104 presses the termination portion 102 outwardly. This spring pad may be formed of an elastomeric material, and serves to provide an engagement force insuring good electrical contact between the individual contact pads of the array 38 and the respective individual connector pads of the array 104.

In order to both provide for manufacturing variability between the carriage 84 and flexible circuit 96, as well as insuring that the array of connector pads 104 is always positioned relative to the carriage 84 so that the individual contacts of the array 38 and of the array 104 are congruent, the carriage 84 carries three outwardly extending cylindrical pin members 106, 108, and 110. These three pin members are in a triangular array that is a right triangle, and which embraces or brackets the location of the array 104, viewing FIG. 11. On these three pin members, the termination portion 102 of the flexible circuit 96 is movably, but non-rotationally received. That is, the termination portion 102 is constrained against rotational movements relative to the carriage 84 in the plane of planarity of the termination portion 102, but dimensional variability between the carriage 84 and termination portion 102 are accommodated, as well as differential expansions and contractions (i.e., because of temperature changes, for example) all while the position of array 104 relative to the carriage 84 is determined and certain.

Referring to FIGS. 11 and 12, it is seen that the termination portion 102 of the flexible circuit 84 defines three holes, 112, 114, and 116. These three holes are located on a triangular array matching that of the three pin members 106–110. Particularly, the hole 112 is round and matching in size to accept the pin 106. The pin 106 and hole 112 are located at the 90 degree vertex of the right triangle of the array of holes and pins 112–116, and 106–110. Further, the holes 114 and 116 are each elongated or slotted, and the axis of elongation of each (indicated by dashed lines and the arrowed numerals 114' and 116') are aligned with the pin 106 and hole 112 at the 90 degree vertex of the triangular array of pins and holes. Further, the pins 108 and 110 are closely but slidably received into the respective slots 114 and 116. Thus, the pin 106 and hole 112 cooperatively define an "instant center" for the carriage 84 and termination portion 102.

While the carriage 84 and termination portion 102 may expand and contract (i.e., due to differing thermal expansion rates, for example), and these expansions and contractions are accommodated be sliding motions of the pins 108 and 10 in slots 114 and 116, the termination portion 102 is not rotational in its own plane relative to the carriage 84. Further, the termination portion 102 may slide slightly axially along the pins 106–110 as the spring pad under this termination portion is compressed (or is relieved) by insertion (and removal) of a print cartridge 10 relative to the carriage 84. However, it will be appreciated that despite these allowed relative movements of the termination portion 102 and carriage 84, the array 104 has a set position relative to the instant center defined at pin 106, and the position of array 104 relative to the carriage 84 is maintained such that when a print cartridge 10 is installed, the array 38 makes sufficiently congruent contact with the array 104 that individual electrical connection of each one of the connector pads and the respective one of the contact pads is assured.

Those ordinarily skilled in the pertinent arts will understand that the pins 106–108 need not be round. Particularly, pin 106 may have a variety of shapes. For example, pin 106 could be cruciform in shape, and be fitted closely into a cruciform-shaped hole in circuit 96.

Viewing now FIG. 13, an alternative embodiment of the invention is depicted, again by isolated view of the portion of the chassis and mechanism of a printer that is equivalent to portion 94 of FIG. 10. Because this alternative embodiment of the invention has many features in common with the embodiment described immediately above, features which are the same or which are analogous in structure or function to those features described above, are indicated on FIG. 13 with the same numeral used above, but having a prime (') added. In FIG. 13, a portion of carriage 84' is seen along with a termination portion 102'. Again, this termination portion 102' defines an array of raised connector pads 104' mirroring the array of contact pads 38 on the front of print cartridge 10. Again, in the carriage 84' is a spring pad (also not visible in the drawing Figures) which in alignment with the connector pads 104' presses the termination portion 102' outwardly.

In the embodiment of FIG. 13, however, an instant center 118 is defined, which instant center is actually located centrally of the array 104'. Because this instant center 118 is located centrally of the array, both manufacturing dimensional variabilities and differential expansion and contraction of the carriage 84' and termination portion 102' have virtually no impact upon congruence of the array 104' with the array 38' of a print cartridge 10' received in the carriage 84'. Viewing now FIG. 13 in greater detail, the definition of the instant center 118 within the array 104' (i.e., without the placing of a pin member at the location of the instant center 118 in this embodiment) is illustrated. Again, the carriage 84' carries three outwardly extending cylindrical pin members 106', 108', and 110'. These three pin members are in a triangular array that is (but need not be) a right triangle. Again, this array of pins 106'–110' embraces (but need not embrace) the location of the array 104', viewing FIG. 13. On these three pin members, the termination portion 102' of the flexible circuit 96' is movably, but non-rotationally received.

Again, the termination portion 102' is constrained against rotational movements relative to the carriage 84' in the plane of planarity of the termination portion 102', but both dimensional variability between the carriage 84' and termination portion 102', as well as differential expansions and contractions, are accommodated, all while the position of array 104' relative to the carriage 84' is determined and certain to a high precision. Referring to FIG. 13, it is seen that the termination portion 102' of the flexible circuit 84' again defines three holes, 112', 114', and 116'. In this embodiment, however, each of the three holes is elongated or slotted, and has an axis of elongation (again indicated with dashed lines and the arrowed numerals 112", 114", and 116") aligned with and passing through the instant center 118. Again, the pins 112', 108', and 110' are closely but slidably received into the respective slots 112', 114', and 116'. Thus, the three pins and three slots cooperatively define an "instant center" for the carriage 84' and termination portion 102' at the point 118 located centrally of the array 104'.

Those ordinarily skilled in the pertinent arts will appreciate that the embodiment of FIG. 13 is not limited to the use of three pins and three slots, and that a larger number of slidably related, and axis-oriented engagement features may be employed to define an instant center at a selected location. Further, pins on the carriage 84' and slots defined in the termination portion 102' need not be employed. For example, the termination portion 102' could define pins or keys that protrude from this termination portion into aligned slots or keyways of the carriage 84', all with the effect that relative motions between the carriage and termination portion are provided with an instant center within the array 104' or selectively positioned relative to the array 104'.

The Carriage 84

In FIG. 14, the "Z" axis is parallel with the longitudinal axis of the slide rod 86 (recalling FIGS. 8 and 9). The "X" axis is pointed to the front of the print cartridge 10 (recalling the coordinate reference established at FIG. 1) and is directed toward the rear of the printer 70. That is, the print cartridge 10 is inserted front end first into the printer 70 so that the front of the print cartridge is disposed toward the rear of the printer, and the rear of the print cartridge is visible at the front panel 74 of the printer. The "Y" axis is pointing vertically upwardly.

Referring now particularly to FIGS. 14 and 18, the carriage 84 includes a carriage base 120 that supports the carriage structures for movement along the guide rod 86. The carriage base 120 has two C-shaped arched supports 122 located at its opposite ends and projecting toward the rear of the printer 70. These arched supports 122 provide bearing support with and slidably engage the slide rod 86.

As is seen in FIGS. 14, 16, and 17, the carriage 84 also includes a chute structure 124 that receives, holds, and aligns the ink-jet print cartridge 10, as is illustrated in FIG. 14. The chute 124 has a left side wall 126, a right side wall 128, and a rear or end wall 130. Located on the rear wall 130 of the chute 124 is the termination portion 102 of flexible circuit 96 with its array 104 of connector pads. Referring to FIGS. 16, and 17, it is seen that on each side wall 126, 128 of the chute 124 is defined an arcuate guide rail 132. The guide rails 132 extend inwardly of the chute 124 toward one another, are angulated slightly upwardly (i.e., in the positive "Y" direction) as they extend in the positive "X" direction, and are convex upwardly because of their arcuate shape.

In this exemplary preferred embodiment of the invention, the guide rails 132 are the guiding features for installing and removing print cartridges 10 from the printer 70 in response to substantially only horizontal translational motions provided by a user of the cartridge and printer. However, it will be appreciated that the invention is not so limited, and that an interrupted guide rail, or a line or array of inwardly extending guide protrusions could be employed as a substitute for guide rail 132. It is seen that each guide rail 132 is generally horizontal, curved (convex upwardly), arcuate, and inclined slightly upward in the positive "Y" direction as it extends toward the rear of the printer 70 into the carriage 84. The guide rails 132 engage the bottom (i.e., at surface 34) of the lips 32, located on the side walls 16, 18 of the print cartridge 10, recalling FIGS. 1–7. Further, the guide rails 132 in the chute 124 serve many functions, as is further described below.

Referring now to FIGS. 15 and 16, it is seen that located in the right side wall 128 of the chute 124 is a cantilever spring 134. This spring 134 has a major axis that is horizontal. The cantilever spring biases or urges the print cartridge 10 horizontally in the negative "Z" direction (i.e., leftwardly viewing the printer 70 from the front) as is illustrated in FIG. 14, against a primary "Z" datum surface 136, seen in FIGS. 17 and 18, on the carriage 84.

In FIGS. 14, 15, 16, and 17, reference numeral 138 indicates a latch spring having a horizontal tab 140 pointing rearwardly in the ink-jet printer 70, recalling FIG. 8. The latch spring 138 has the tab 140 rearwardly directed in this manner to assist in achieving the objective of a low over all height for the printer 70. The latch spring 138 engages latch 42, recalling FIG. 1, of the print cartridge 10 when this cartridge is installed into the carriage 84. The latch spring 138 is fabricated from sheet metal, and is attached to vertically and horizontally extending rib features 142 molded in the outside of the walls 126,128 of the chute 124.

As is seen in FIGS. 15, 16, 17, and 18, located on the inside of the left side wall 126 and at the inside of the right side wall 128 at the bottom of the chute 124 and extending inwardly of this chute are the primary "X" and "Y" datum surfaces 144, and 146, respectively, of the carriage 84. The corresponding datum surfaces 58a, 60 on the print cartridge 10 illustrated in FIGS. 1–7 are urged against the primary "X" and "Y" datum surfaces 144, 146 in the chute by the latch spring 138. There is an additional "X" axis datum surface 148 defined adjacent to the upper extent of the rear wall 130 of the chute 124 (i.e., above the termination portion 102 of flexible circuit 96). The additional "X" axis datum 148 locates rotation or pitching of the print cartridge 10 about the "Z" axis to a known point.

Interface of Print Cartridge 10 and Carriage 84

Continuing with a consideration of the functions of the chute structure 124, and guide rails 132 in particular, it is seen that first, the rails 132 act as a target for the user when a print cartridge is to be installed in the carriage 84. The guide rails 132 aid in receiving and locating the print cartridge 10 vertically between the side walls 126, 128 within the carriage 84, which is only partially visible to the user. Second, once the print cartridge is resting on the guide rails and the print cartridge is pushed horizontally forward (i.e., toward the rear of the printer 70) by the user, the guide rails 132 guide the print cartridge 10 in an upward pitching motion (i.e., upward at the front end of the print cartridge) so that the print cartridge datum structures 58a, 60 move sufficiently up to move over the "X" and "Y" carriage datum structures, to be received on and behind these carriage datum surfaces. This locates the front lower portion of the print cartridge in "X" and "Y" directions. Third, when a print cartridge is being unlatched from the carriage by the user, the guide rails limit the rotation or pitching of the print cartridge, as is described in greater detail below, so that the print cartridge does not come tumbling out of the printer. Further, it will be appreciated that the low profile aspect of the print cartridge 10 results from the rectangular prismatic body 12 having its major axis substantially aligned with the horizontal translation motion used to install and remove the print cartridge into and from the carriage 84. This low profile aspect of the print cartridge 10 allows the printer 70 to have a low overall height (i.e., along the "Y" axis).

Horizontal Print Cartridge Loading

Figure 19:
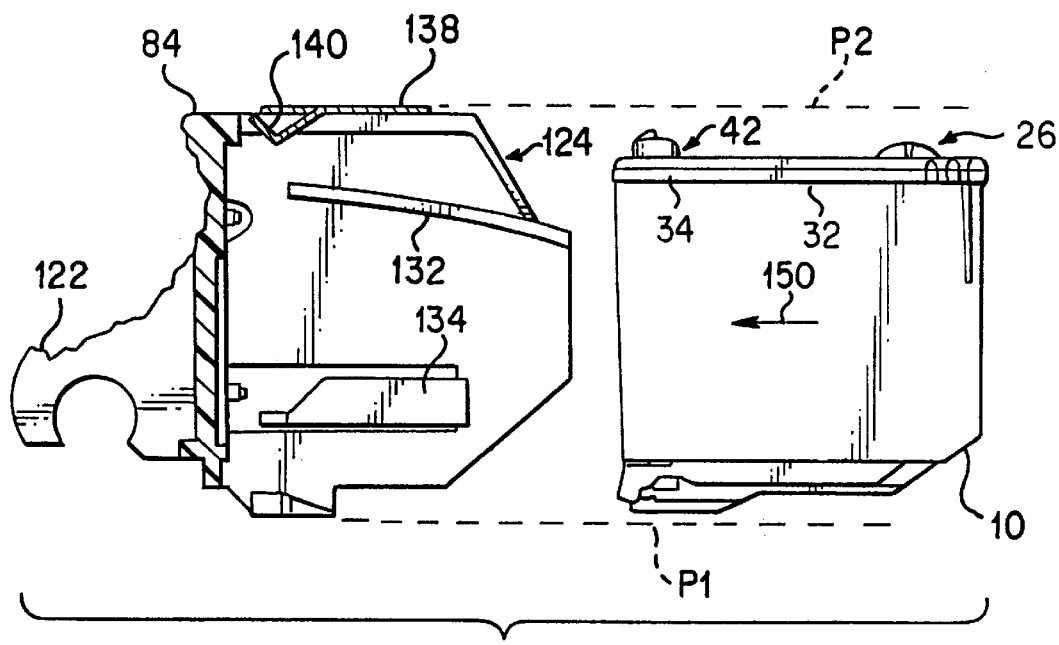
Figure 20:
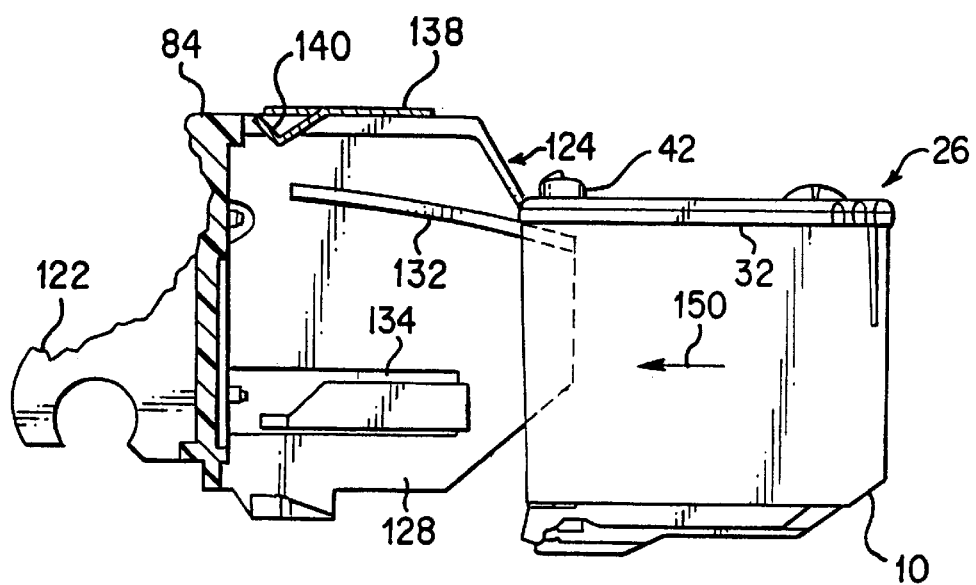

Referring now to FIGS. 19, 20, 21, 22, and 23, and considering first FIG. 19, it is seen that in order to load a print cartridge 10 into the carriage 84, a user generally aligns the print cartridge 10 vertically and laterally with the carriage 84. The user can accomplish this by holding the cartridge between thumb and fingers using the engagement surfaces 26. It will be noted that in so engaging the print cartridge 10, the user's finger contact with the print cartridge body 12 is remote from the electrical contact pads 38. Thus, the contact pads are not at risk of being contaminated by the user's fingerprints. Those ordinarily skilled in the pertinent arts will appreciate that fingerprints are not only oily, but that they generally are acidic, and that over time, acid from fingerprints could corrode the contacts 38, leading to less than optimum electrical contact. However, the print cartridge 10 does not suffer from this deficiency because the user's finger contact with the cartridge 10 is isolated by the major dimension of the cartridge body 12 from the contacts 38.

Next, the user translates the print cartridge horizontally (i.e., substantially between the planes P1 and P2, which have been added to FIG. 19 for reference (recalling FIG. 8) forwardly toward the carriage 84, as indicated by the arrowed numeral 150. During this forward motion of the print cartridge 10 the guide rails 132 act as targets for the user because visibility of the carriage 84 is restricted by the housing 72 of the printer 70. As was pointed out above, the print cartridge 10 has outwardly extending lips 32 on its side walls 16, 18, and the underside surfaces 34 of these lips slidably engage on the guide rails 132, viewing now FIG. 20. The lips 32 on each side of the print cartridge 10 are placed on the guide rails 132 of the chute structure 124, and the guide, rails thereafter support the cartridge vertically. The user continues to horizontally translate the print cartridge 10 forwardly, as is indicated by the arrowed numeral 150 in FIG. 20. The rear end of the print cartridge 10 may still be grasp by use of the engagement features 26.

Figure 21:
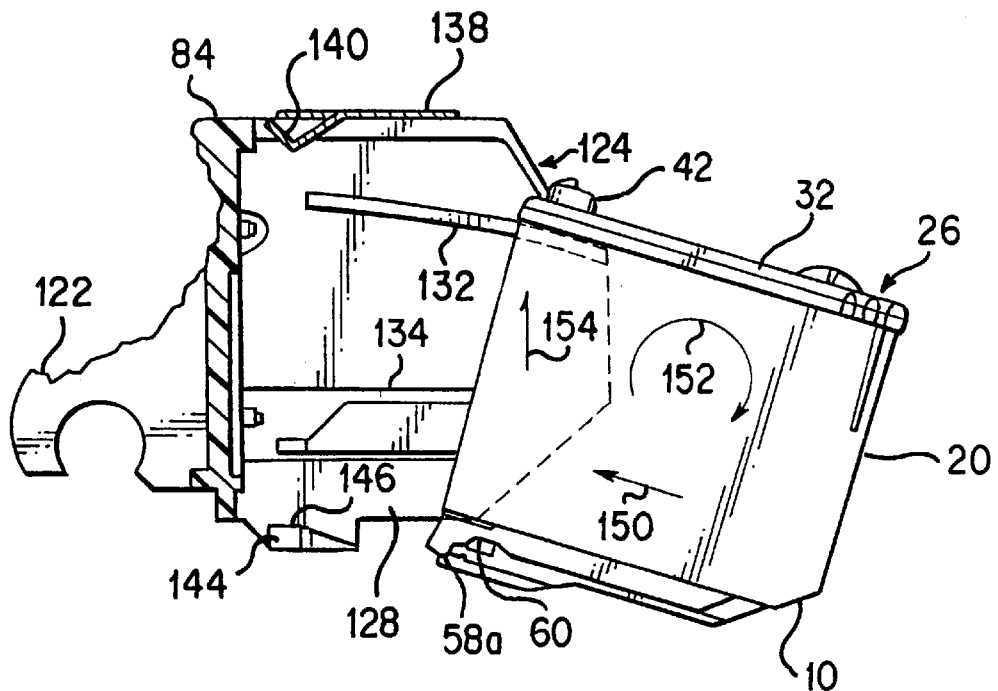

Referring now to FIG. 21, it is to be noted that an upward pitching rotation of the print cartridge 10 results because although each guide rail 132 is generally horizontal, these guide rails are also arcuate, convex upwardly, and inclined slightly upwardly in the positive "Y" direction as they extend toward the rear wall 130 of the chute structure 124, viewing FIG. 21. This upward pitching of the print cartridge 10 is indicated in FIG. 21 by the motion arrow 152, and it will also be noted that the print cartridge 10 is translated vertically upwardly in the positive "Y" direction (indicated by arrowed numeral 154 )in response to horizontal translation inwardly of the carriage 84 (again indicated by arrowed numeral 150 in FIG. 21). As the print cartridge 10 slides further forwardly along the guide rails 132, the cantilever spring 134 urges the print cartridge leftwardly (i.e., looking into the chute 124) so that the "Z" axis datum surfaces will control position of the print cartridge in this "Z" direction.

Figure 22:
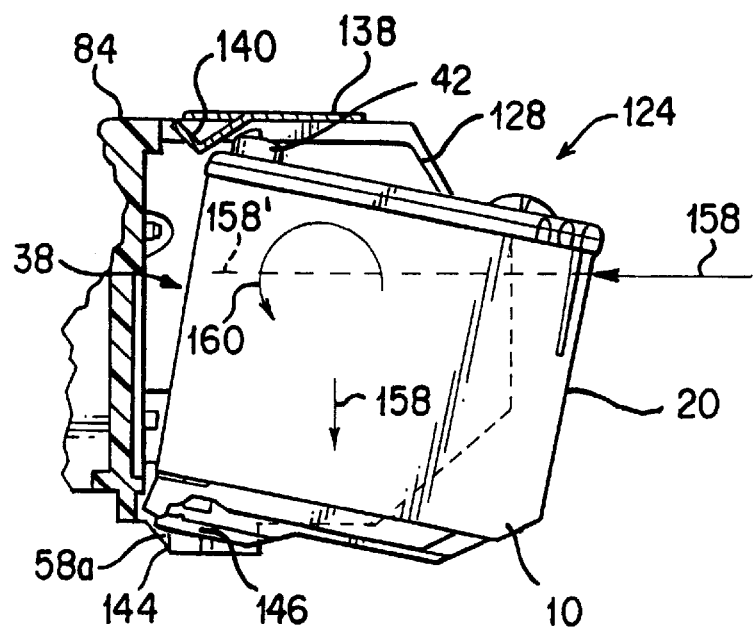

Further, the combination of the three motions (horizontally forward translation, upward pitching, and vertically upward translation), indicated by the motion arrows 150, 152, and 154 of FIG. 21, causes the datum surfaces 58a and 60 on the print cartridge 10 to be brought up, over, and respectively onto and behind, the corresponding datum surfaces 144 and 146 at the chute 124 of the carriage 84, Viewing FIG. 22. The datum surfaces 58b of the print cartridge 10 engage against the rear wall 130 of the chute 124 to limit further forward motion of the lower front of the print cartridge, viewing FIG. 22. Further, subsequent downward translational motion (i.e., in the negative "Y" direction) of the print cartridge 10 to result in the datum surfaces 58a being received behind the surfaces 144, is indicated on FIG. 22 by the arrow 156. It will be noted viewing FIG. 22 that the engagement of the latch 42 with the latch spring 138 insures that motion 156 takes place, so that the "X" axis datums 58a and 144 properly engage one another.

It will also be noted viewing FIGS. 21 and 22 that the horizontal translational motion of the print cartridge 10 between the positions of these two Figures results in the print cartridge 10 moving progressively further into the case 72 of printer 70. Regardless of whether the printer 70 has a single carriage 84 (i.e., as illustrated) or has two or more carriages side by side, during the illustrated forward movement of the print cartridge 10 into the carriage 84, a point will be reached at which the user probably will be more comfortable simply pushing the print cartridge 10 horizontally forward with a finger tip on rear wall 20 rather than grasping the features 26. Thus, in FIG. 22, the forward pushing force exerted by a user on the print cartridge 10 is illustrated by arrowed numeral 158. As the dashed line 158' indicates, this forward pushing force from the user is applied to a surface remote from the array of contact pads 38, but passes along a line extending through the array 38 of contact pads. As is seen in FIG. 22, the datum surfaces 58b of the print cartridge 10 engage against the rear wall 130 of the carriage 84, preparing the print cartridge to pitch upwardly at its rear wall 20.

Subsequently, as the user continues to apply force along the line 158, the forward horizontal translational motion of the print cartridge 10 illustrated in FIG. 22 continues until the datum surfaces on the print cartridge 10 and the datum surfaces on the carriage 84 all engage one another, the print cartridge 10 pitches upwardly at its rear wall 20, and the end of the horizontal tab 140 of latch spring 138 seats into the well 48 and against wall 46 of the latch structure 42. This "latching" of the print cartridge 10 into the chute 124 of carriage 84 is illustrated in FIG. 23. It will be noted that the user achieves this latching of print cartridge 10 into carriage 84 by further application of force 158 until the print cartridge "snaps" into latched engagement with the carriage 84. Further, the force 158 passes through the array of contact pads 38 so that good electrical engagement of these contact pads 38 with the connector pads 104 is assured. The latching of print cartridge 10 into the carriage 84 is accompanied by a pitching motion indicated on FIG. 22 by the arrowed numeral 160. This is a downward pitching motion according to the notation established earlier. But, it is recognized that the rear of the print cartridge is actually pitching up.

Further pitching of the print cartridge 10 is prevented by the front wall 14 engaging additional datum surface 148. Additionally, the elastomeric spring pad behind the termination portion 102 will assist in continuously urging the "X" axis datum surfaces 58a and 144 into engagement once the user discontinues force 158. It should be appreciated that during installation of the print cartridge 10 this spring pad and the latch spring 138 continuously push the print cartridge 10 outwardly of the chute 124. However, once the latch spring 138 engages into well 48, the outward force from the latch spring ceases. The latch spring force on print cartridge 10 is thus seen to be binary, and to prevent false latching of the print cartridge.

Horizontal Print Cartridge Unloading

Referring now to FIG. 23, is seen that when a user wishes to unlatch and remove a print cartridge 10 from the carriage 84, this user first applies a downwardly directed force (indicated by arrowed numeral 162) to the top wall or lid of the print cartridge adjacent to the rear wall 20. Conveniently, the button structure 66 is positioned and ergonomically presented to the user adjacent to the rear of the print cartridge 10 so that the force 162 may be conveniently applied with a finger tip. That is, the rear of the print cartridge 10 extends out from the carriage 84, as is illustrated in FIG. 14, and this downwardly directed force 162 may be applied to the button-like feature 66 on the lid 40. The downwardly directed force 162 causes the latch spring 138 to disengage from latch structure 42, and results in a downward pitching motion at the rear of the print cartridge 10, as is indicated by the motion arrow 164, viewing FIG. 24. The downward translational motion of the print cartridge 10 (i.e., at rear wall 20) is indicated by arrow 166. As the datum surfaces 58, 60 on the print cartridge 10 pivot around the datum surfaces 144, 146 on the carriage 84, the lips 32 come once again into contact with guide rails 132. These guide rails 132 by engaging the lips 32 limit the pitching motion indicated by arrow 164, so that the print cartridge does not pop or fall out of the printer.

Once the print cartridge is unlatched, its rear end is more exposed, and the engagement features 26 are again accessible for the user to grasp and translate the print cartridge horizontally outwardly of the carriage 84. Viewing FIG. 25, it is seen that the horizontal translational movement to remove print cartridge 10 from carriage 84 (indicated by arrow 168) is again performed substantially between the horizontal planes P1 and P2.

Although specific embodiments of the invention have been described and illustrated, the invention is not to be limited to the specific forms or arrangement of parts so described and illustrated. Thus, it is to be appreciated that the present invention is subject to several modifications and alterations that will suggest themselves to those ordinarily skilled in the pertinent arts. As mentioned above, for example, the guide rails 132 do not need to be continuous in the "X" direction. Instead, the guide rails 132 could be discontinuous, or the guide structure could be provided by a line or array of inwardly extending support protrusions. These support protrusions would engage and support the print cartridge 10 at surfaces 34 of lips 32, and would provide for and allow the necessary pitching motions and translational motions of the print cartridge to effect its installation and removal from the carriage 84. Additionally, the print cartridge 10 does not necessarily have to be a rectangular prismatic body. Other forms and configurations for a print cartridge according to this invention are possible, and each of these is intended to be encompassed within the appended claims. Further, the reference to particularly preferred exemplary embodiments of the invention does not imply a limitation on the invention, and no such limitation is to be inferred. The invention is limited only by the spirit and scope of the appended claims.

We claim:

1. Apparatus for controllably movably aligning a shape-retaining flexible circuit relative to an ink jet printer carriage, said apparatus comprising:
   a planar elongate shape-retaining flexible circuit, said flexible circuit having a shape-retaining planar termination portion with an array of connector pads;
   a printer carriage having a chute for receiving an ink jet printer cartridge, said chute leading said ink jet printer cartridge into juxtaposition with a planar wall portion of said printer carriage, said termination portion and said wall portion being in substantially parallel and controlled translationally movable, but non-rotational, juxtaposition to one another so as to present said array of connector pads at said chute in congruence to a matching array of contact pads on said ink jet printer cartridge;
   each of said wall portion and said termination portion defining respective parts of plural slidably-associated connecting features for slidably connecting said termination portion and said wall portion, and said slidably associated connecting features being arrayed so as to:
      allow relative movement of said termination portion and wall portion perpendicular to the substantially parallel planes of each, and
      so as to allow controlled relative translational movement of said termination portion and wall portion parallel to the planes of each,
      while cooperatively constraining said termination portion against rotation in its plane relative to said wall portion; and
      said plural slidably associated connecting features cooperatively defining an instant center at which both said wall portion and said termination portion are substantially fixed against relative translational movement parallel to the plane of each,
   whereby, said array of connector pads of said flexible circuit is controllably movable in translation relative to said chute and wall portion both perpendicular to and parallel to said plane of said termination portion, and is constrained against rotation in said plane relative to said wall portion, but said array of connector pads is also positioned certainly relative to said wall portion and chute by said instant center.

2. The apparatus of claim 1 wherein said slidably-associated connecting features includes said wall portion defining an array of at least three pins extending perpendicularly therefrom, said termination portion defining a matching array of at least three holes respectively received slidably over said pins, whereby sliding of said termination portion along said pins allows controlled relative movement of said termination portion and wall portion perpendicularly to the plane of each.

3. The apparatus of claim 2 wherein said pins are three in number, and are in a triangular array bracketing said array of connector pads.

4. The apparatus of claim 3 wherein said triangular array is a right triangle.

5. The apparatus of claim 2 wherein said array of holes of said termination portion are three in number, and include a pair of slots, each one of said pair of slots having an axis of elongation, and the axes of elongation of said pair of slots intersecting at the third one of said three holes to define said instant center at said third one of said three holes.

6. The apparatus of claim 5 wherein said three holes are in a triangular array which is a right triangle, and said third one of said three holes is located at the 90-degree vertex of said right triangle.

7. The apparatus of claim 2 wherein said array of holes is three in number, and each one of said three holes is an elongated slot with a respective axis of elongation, each of said axes of elongation of said three slotted holes intersecting at a point to cooperatively define said instant center at said point.

8. A method of controllably movably positioning a flexible circuit termination portion relative to a chute of an ink jet printer carriage, so that an array of contact pads on an ink jet print cartridge received in said chute is congruent with and electrically contacts a matching array of connector pads on said flexible circuit termination portion, said method including steps of:
   providing said flexible circuit with a shape-retaining planar termination portion carrying said array of connector pads;
   providing said printer carriage with a planar wall portion, disposing said termination portion and said wall portion being in substantially parallel and controlled translationally movable, but non-rotational, juxtaposition to one another so as to present said array of connector pads at said chute in congruence to a matching array of contact pads on an ink jet printer cartridge received into said chute;
   defining on each of said wall portion and on said termination portion respective parts of plural slidably-associated connecting features, and utilizing said connecting features for slidably connecting said termination portion and said wall portion so as to: allow relative movement of said termination portion and wall portion perpendicular to the substantially parallel planes of each, so as to allow controlled relative translational movement of said termination portion and wall portion parallel to the planes of each, and to cooperatively constrain said termination portion against rotation in its plane relative to said wall portion; and
   utilizing said plural slidably associated connecting features to cooperatively define an instant center at which both said wall portion and said termination portion are substantially fixed against relative translational movement parallel to the plane of each, whereby, said array of connector pads of said flexible circuit is controllably movable in translation relative to said chute and wall portion both perpendicular to and parallel to said plane of said termination portion and is also constrained against rotation in its plane relative to said wall portion, and said array of connector pads is also positioned certainly relative to said wall portion and chute by said instant center.

9. The method of claim 8 further including the steps of defining said slidably-associated connecting features by providing on said wall portion an array of at least three pins extending perpendicularly therefrom, and providing on said termination portion a matching array of at least three holes, slidably receiving said termination portion at said matching array of holes over said pins, and utilizing sliding of said termination portion along said pins to control relative movement of said termination portion and wall portion perpendicularly to the plane of each.

10. The method of claim 9 including the step of providing three pins in said array of pins, and providing said three pins in a triangular array bracketing said array of connector pads.

11. The method of claim 10 including the step of disposing said three pins of said array of pins in a right triangle.

12. The method of claim 8 further including the steps of providing said array of holes of said termination portion with three holes, configuring a pair of said three holes to be slotted and to define a respective axis of elongation, and disposing the axes of elongation of said pair of slotted holes to intersect at the third one of said three holes, so as to define said instant center at said third one of said three holes.

13. The method of claim 12 further including the steps of disposing said three holes are in a triangular array which is a right triangle, and disposing said third one of said three holes at the 90-degree vertex of said right triangle.

14. The method of claim 8 further including the steps of providing said array of holes of said termination portion with three holes, configuring each one of said three holes to be slotted and to define a respective axis of elongation, and disposing the axes of elongation of said three holes to intersect at a determined point, so as to define said instant center at said determined point.

* * * * *